US008785911B2

(12) United States Patent
Chen et al.

(10) Patent No.: US 8,785,911 B2
(45) Date of Patent: Jul. 22, 2014

(54) GRAPHENE OR CARBON NANOTUBE DEVICES WITH LOCALIZED BOTTOM GATES AND GATE DIELECTRIC

(75) Inventors: Zhihong Chen, Valhalla, NY (US); Aaron Daniel Franklin, Croton on Hudson, NY (US); Shu-Jen Han, Cortlandt Manor, NY (US); James Bowler Hannon, Lincolndale, NY (US); Katherine L. Saenger, Ossining, NY (US); George Stojan Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 596 days.

(21) Appl. No.: 13/167,570

(22) Filed: Jun. 23, 2011

(65) Prior Publication Data

US 2012/0326126 A1    Dec. 27, 2012

(51) Int. Cl.
*H01L 21/336*    (2006.01)

(52) U.S. Cl.
USPC .............. 257/29; 257/E29.005; 257/E29.082; 257/E29.297; 257/E21.411; 438/158

(58) Field of Classification Search
USPC ............. 257/29, E29.005, E29.082, E29.297, 257/E21.411
See application file for complete search history.

(56) References Cited

U.S. PATENT DOCUMENTS

| | | | |
|---|---|---|---|
| 6,972,467 B2 | 12/2005 | Zhang et al. | |
| 7,482,232 B2 | 1/2009 | Appenzeller et al. | |
| 7,619,257 B2 | 11/2009 | Pfeiffer | |
| 2007/0080409 A1 | 4/2007 | Seliskar | |
| 2008/0258207 A1 | 10/2008 | Radosavljevic et al. | |
| 2009/0181502 A1 | 7/2009 | Parikh et al. | |
| 2010/0051960 A1 | 3/2010 | Chen et al. | |
| 2011/0068323 A1 | 3/2011 | Chen et al. | |
| 2011/0127488 A1* | 6/2011 | Brown et al. ..................... | 257/9 |

OTHER PUBLICATIONS

J. Appenzeller, "Carbon Nanotubes for High-Performance Electronics-Progress and Prospect," Proceedings of the IEEE, vol. 96, No. 2, pp. 201-211 (Feb. 2008).
D. Farmer et al., "Atomic Layer Deposition on Suspended Single-Walled Carbon Nanotubes via Gas-Phase Noncovalent Functionalization," Nano Letts., 6(4): 699-703 (2006).
Y. Lu et al., "DNA Functionalization of Carbon Nanotubes for Ultrathin Atomic Layer Deposition of High k Dielectrics for Nanotube Transistors with 60 mV/Decade Switching," JACS, vol. 128, pp. 3518-3519 (2006).

(Continued)

*Primary Examiner* — Marc Armand
(74) *Attorney, Agent, or Firm* — Vazken Alexanian; Michael J. Chang, LLC (57) ABSTRACT

Transistor devices having nanoscale material-based channels (e.g., carbon nanotube or graphene channels) and techniques for the fabrication thereof are provided. In one aspect, a transistor device is provided. The transistor device includes a substrate; an insulator on the substrate; a local bottom gate embedded in the insulator, wherein a top surface of the gate is substantially coplanar with a surface of the insulator; a local gate dielectric on the bottom gate; a carbon-based nanostructure material over at least a portion of the local gate dielectric, wherein a portion of the carbon-based nanostructure material serves as a channel of the device; and conductive source and drain contacts to one or more portions of the carbon-based nanostructure material on opposing sides of the channel that serve as source and drain regions of the device.

24 Claims, 6 Drawing Sheets

(56) References Cited

OTHER PUBLICATIONS

A. Javey et al. "High k Dielectrics for Advanced Carbon-Nanotube Transistors and Logic Gates," Nature Mater., vol. 1, 241-246 (2002).
S. Kim et al., "Realization of a High Mobility Dual-Gated Graphene Field-Effect Transistor with Al2O3 Dielectric," Applied Physics Letters, vol. 94, pp. 062107 (2009).
Lee et al., "Carbon nanotube p-n junction diodes," Applied Physics Letters, vol. 85, No. 1, pp. 145-147 (2004).
M. Zhang et al., "Novel local silicon-gate carbon nanotube transistors combining silicon-on-insulator technology for integration," IEEE Trans on Nanotech, v. 8, No. 2, pp. 260-268 (Mar. 2009).

* cited by examiner

GRAPHENE OR CARBON NANOTUBE DEVICES WITH LOCALIZED BOTTOM GATES AND GATE DIELECTRIC

STATEMENT OF GOVERNMENT RIGHTS

This invention was made with Government support under Contract number FA8650-08-C-7838 awarded by (DARPA) Defense Advanced Research Projects Agency. The Government has certain rights in this invention.

FIELD OF THE INVENTION

The present invention relates to transistor devices, and more particularly, to transistor devices having nanoscale material-based channels (e.g., carbon nanotube or graphene channels) and techniques for the fabrication thereof.

BACKGROUND OF THE INVENTION

The integration of carbon nanostructures as channel materials in the next generation of electronic devices offers many advantages over the continued scaling of silicon (Si). Carbon nanotubes and graphene are two nanoscale forms of carbon that exhibit extremely high current carrying capacity and mobilities several orders of magnitude beyond the theoretical limit for Si. Additionally, carbon nanotubes (one-dimensional) and graphene (two-dimensional) are low-dimensional (ultra thin-body) materials, allowing them to be aggressively scaled in field-effect transistors without incurring deleterious short-channel effects that hinder modern scaled devices. See, for example, J. Appenzeller, "Carbon Nanotubes for High-Performance Electronics-Progress and Prospect," Proceedings of the IEEE, vol. 96, no. 2, pp. 201-211 (February 2008), the contents of which are incorporated by reference herein.

One of the foremost challenges to scaling either of these nanomaterials is the difficulty of establishing thin, uniform and high-quality dielectrics on their surfaces. The surface of both materials consists of strong $sp^2$ carbon bonds with nominally no surface states. The absence of open surface bonds makes it nearly impossible to nucleate or deposit insulators, especially with the monolayer accuracy that is needed for scaled gate dielectrics. Approaches to overcoming this obstacle thus far have involved 1) gas-phase functionalization of the carbon surface with a noncovalent monolayer (see, for example, D. Farmer et al., "Atomic Layer Deposition on Suspended Single-Walled Carbon Nanotubes via Gas-Phase Noncovalent Functionalization," Nano Letts., 6(4): 699-703 (2006), the contents of which are incorporated by reference herein), 2) wrapping of carbon nanotubes with molecules (see, for example, Y. Lu et al., "DNA Functionalization of Carbon Nanotubes for Ultrathin Atomic Layer Deposition of High k Dielectrics for Nanotube Transistors with 60 mV/Decade Switching," JACS, vol. 128, pp. 3518-3519 (2006), the contents of which are incorporated by reference herein), 3) overgrowth of dielectric layers to encompass carbon nanotubes (see, for example, A. Javey et al. "High-k Dielectrics for Advanced Carbon-Nanotube Transistors and Logic Gates," Nature Mater., vol. 1, 241-246 (2002), the contents of which are incorporated by reference herein) and 4) deposition of thin (less than two nanometers (nm)) metal followed by its oxidation (see, for example, S. Kim et al., "Realization of a High Mobility Dual-Gated Graphene Field-Effect Transistor with $Al_2O_3$ Dielectric," Applied Physics Letters, vol. 94, pp. 062107 (2009), the contents of which are incorporated by reference herein). All of these approaches are completed by the atomic layer deposition (ALD) of a high-k dielectric.

The first two approaches provide for good uniformity and dielectrics down to about two nm in thickness have been reported. However, the molecular layers have been shown to interact with the carbon bonds, creating scattering centers that cause the mobility to suffer greatly. In fact, since all carriers are on the surface of these nanostructures, the carriers strongly couple to any material that is deposited around them, causing degradation of the transport properties. Additionally, when using molecules such as deoxyribonucleic acid (DNA) to create a nucleation layer around carbon nanotubes the uniformity can be compromised as a result of the relatively large molecule diameter (four nm for DNA) compared to the carbon nanotubes (about 1.5 nm). The last two approaches provide no scheme for scaling the thickness of the dielectric, i.e., from about eight nm to about 15 nm of dielectric is necessary to ensure complete coverage of the carbon surface.

Therefore, device fabrication techniques that avoid the above-described problems associated with forming thin, uniform and high-quality dielectrics on the surfaces of nanomaterials would be desirable.

SUMMARY OF THE INVENTION

The present invention provides transistor devices having nanoscale material-based channels (e.g., carbon nanotube or graphene channels) and techniques for the fabrication thereof. In one aspect of the invention, a transistor device is provided. The transistor device includes a substrate; an insulator on the substrate; a local bottom gate embedded in the insulator, wherein a top surface of the gate is substantially coplanar with a surface of the insulator; a local gate dielectric on the bottom gate (i.e., a gate dielectric localized to the bottom gate); a carbon-based nanostructure material over at least a portion of the local gate dielectric, wherein a portion of the carbon-based nanostructure material serves as a channel of the device; and conductive source and drain contacts to one or more portions of the carbon-based nanostructure material on opposing sides of the channel that serve as source and drain regions of the device.

In another aspect of the invention, a method of fabricating a transistor device is provided. The method includes the following steps. A substrate is provided having an insulator thereon. A local bottom gate is formed in a trench in the insulator. A local gate dielectric is formed on the bottom gate. A carbon-based nanostructure material is formed over at least a portion of the local gate dielectric, wherein a portion of the carbon-based nanostructure material serves as a channel of the device. Conductive source and drain contacts are formed to one or more portions of the carbon-based nanostructure material on opposing sides of the channel that serve as source and drain regions of the device.

In yet another aspect of the invention, another method of fabricating a transistor device is provided. The method includes the following steps. A wafer is provided having a layer of conductive material on an insulating layer. Cavities are formed in the wafer to isolate one or more portions of the conductive material, wherein an isolated portion of the conductive material serves as a local bottom gate of the device. The cavities are filled with a dielectric. A gate dielectric is formed on the bottom gate. A carbon-based nanostructure material is formed over at least a portion of the gate dielectric, wherein a portion of the carbon-based nanostructure material serves as a channel of the device. Conductive source and drain contacts are formed to one or more other of the carbon-based nanostructure material on opposing sides of the channel that serve as source and drain regions of the device.

A more complete understanding of the present invention, as well as further features and advantages of the present invention, will be obtained by reference to the following detailed description and drawings.

DETAILED DESCRIPTION OF PREFERRED EMBODIMENTS

Provided herein are localized bottom gate transistor devices and techniques for the fabrication thereof wherein the transistor devices have a channel(s) formed from a nanoscale material, such as carbon nanotubes or graphene, and wherein the bottom gate dielectric (or at least a lower layer of a multilayer bottom gate dielectric) is localized to the bottom gate area. The present fabrication process can be carried out in a number of different ways.

In a first exemplary embodiment, a gate dielectric local to a bottom gate (or at least a lower layer of a multilayer bottom gate dielectric) is formed on a bottom gate that has been embedded in a trench in an insulator. To ensure a structure in which the gate dielectric is localized to the bottom gate (i.e., the gate dielectric is precisely aligned to the bottom gate and has the same lateral dimensions as the bottom gate), a self-aligned gate dielectric formation process is employed. Two self-aligned approaches are now described wherein the gate dielectric formed is precisely local to the bottom gate. In the first self-aligned approach, shown in FIGS. 1-6, an upper portion of an embedded gate is oxidized. In the second self-aligned approach, shown in FIGS. 7-10, the gate and the gate dielectric are deposited in a trench during the same lift-off step, using the same lift-off stencil. It is noted that other self-aligned deposition processes, such as selective deposition, may also be employed.

FIGS. 1-6 illustrate one exemplary embodiment wherein a localized gate dielectric is formed by oxidation (e.g., thermal oxidation). In this particular example, the gate initially includes a lower electrically conductive material (or layered stack of materials) that is relatively resistant to oxidation and an upper material (or layered stack of materials) that is easily oxidized to form an insulating gate dielectric, allowing selective oxidation of the upper conductive material. However, in a non-selective version of this process, the gate may alternatively be formed from a single electrically conductive material having an upper portion that is oxidized to form an insulating gate dielectric.

Figure 1:
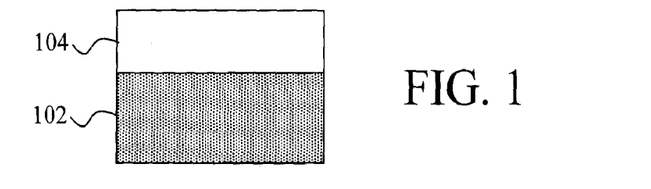
FIG. 1 is a cross-sectional diagram illustrating a starting structure for a first transistor device fabrication process having a substrate with a layer of insulator thereon according to an embodiment of the present invention.

FIG. 1 is a cross-sectional diagram illustrating a starting structure for the fabrication process, namely a substrate 102 having a layer of insulator 104 thereon. By way of example only, substrate 102/insulator 104 can be an oxidized silicon (Si) substrate (i.e., wherein insulator 104 is silicon dioxide ($SiO_2$)).

Figure 2:
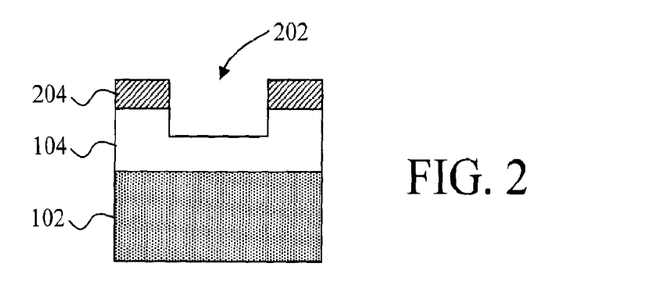
FIG. 2 is a cross-sectional diagram illustrating a trench having been patterned in the insulator using a lift-off stencil as a mask according to an embodiment of the present invention.

Next, a trench is patterned in the insulator. The trench will mark the footprint and location of a local bottom gate of the device. In general, a transistor includes a source and a drain connected by a channel(s), and a gate which regulates electron flow through the channel. The gate is separated from the channel by a dielectric material (a gate dielectric).

Specifically, FIG. 2 is a cross-sectional diagram illustrating a trench 202 having been patterned in insulator 104. According to an exemplary embodiment, the local bottom gate that will be formed in insulator 104 (see below) will provide all of the necessary channel modulation for the device. With such a configuration, doping of substrate 102 is not needed.

By way of example only, trench 202 can be formed using an anisotropic dry etch (e.g., reactive ion etching (RIE)) performed using lift-off stencil 204 (e.g., a patterned resist layer) as a mask. This is followed by a wet chemical etch to undercut trench 202 (with respect to the lift-off stencil 204) to prevent the build-up of gate material that is to be deposited in the next step, thus providing as smooth a surface as possible for channel formation.

Figure 3:
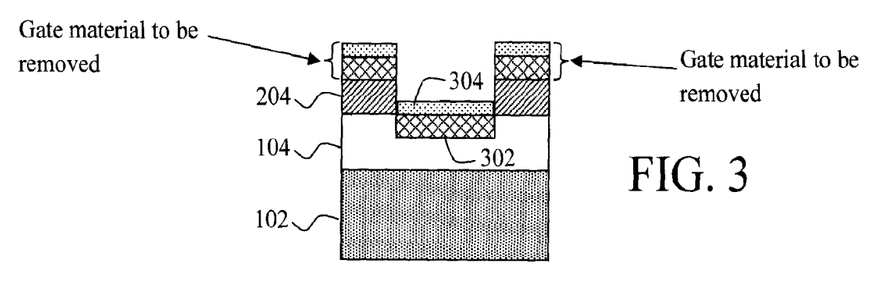
FIG. 3 is a cross-sectional diagram illustrating a bilayer of gate metal (palladium (Pd)/titanium (Ti)) having been deposited into the trench and onto the lift-off stencil according to an embodiment of the present invention.

A bilayer of gate metal is then blanket deposited onto the device structure (i.e., onto the lift-off stencil and into the trench). See FIG. 3. FIG. 3 is a cross-sectional diagram illustrating a bilayer of gate metal having been deposited into trench 202. Specifically, a first metal layer 302 is blanket deposited onto the device structure and into trench 202. Next, second metal layer 304 is deposited on first metal layer 302. As described above, metal layer 302 is preferably made up of a metal that is relatively resistant to oxidation (e.g., a noble or quasi-noble metal such as silver (Ag), gold (Au), iridium (Ir), nickel (Ni), palladium (Pd), platinum (Pt) or an alloy containing at least one of the foregoing metals) and metal layer 304 is preferably made up of a metal that is relatively easily oxidized (e.g., aluminum (Al), hafnium (Hf), niobium (Nb), tantalum (Ta), titanium (Ti) or an alloy containing at least one of the foregoing metals). It is noted that resistance to (or relative ease of) oxidation is roughly correlated with the thermodynamic heat of formation ($\Delta H_f$) of the metal oxide, with easily oxidized metals having oxides with large negative $\Delta H_f$ values. The gate metal outside of trench 202 will be removed later in the process. According to an exemplary embodiment, first metal layer 302 is a Pd layer and second metal layer 304 is a Ti layer both deposited, e.g., using electron beam or thermal evaporation. Thus, in this example, the bilayer of gate metal includes a Ti layer over a Pd layer.

According to another exemplary embodiment, first metal layer 302 and/or second metal layer 304 is/are made up of multiple layers and/or a mixture of materials. By way of example only, first metal layer 302 can be made up of a layered stack of materials, each layer containing a metal (or an alloy of multiple metals) that is relatively resistant to oxidation (e.g., Ag, Au, Ir, Ni, Pd, Pt or an alloy containing at least one of the foregoing metals, as described above). Likewise, second metal layer 304 can be made up of a layered stack of materials, each layer containing a metal (or an alloy of multiple metals) that is relatively easily oxidized (e.g., Al, Hf, Nb, Ta, Ti or an alloy containing at least one of the foregoing metals, as described above). Further, each or both of first metal layer 302 and second metal layer 304 can be made up of multiple layers of materials, first metal layer 302 can be made up of multiple layers of materials while second metal layer 304 can be a single material or vice versa. An example of such a layered stack gate configuration is shown illustrated in FIG. 16.

Figure 4:
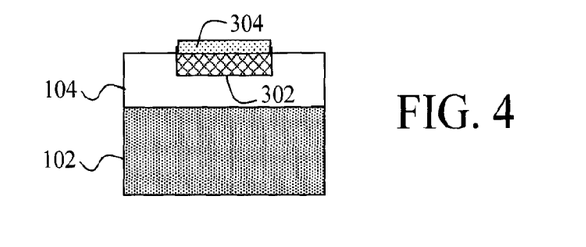
FIG. 4 is a cross-sectional diagram illustrating the gate metal outside of the trench having been removed according to an embodiment of the present invention.

A lift-off process is then performed on the structure of FIG. 3 to remove the lift-off stencil and hence the gate metal outside of the trench. See FIG. 4. FIG. 4 is a cross-sectional diagram illustrating the gate metal outside of trench 202 having been removed. The process for performing this lift-off procedure is known to those of skill in the art and thus is not described further herein.

Figure 5:
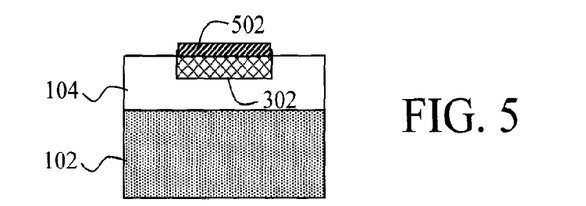
FIG. 5 is a cross-sectional diagram illustrating thermal oxidation having been used to oxidize the Ti in the metal gate bilayer into a titanium oxide ($TiO_2$) layer according to an embodiment of the present invention.

Oxidation (e.g., thermal oxidation) is then used to oxidize the top metal layer. In the example provided above, the top metal layer (second metal layer 304) is a Ti layer. In the case where second metal layer 304 is a Ti layer, oxidation of the Ti layer results in the formation of a titanium oxide ($TiO_2$) layer over the, e.g., Pd, first metal layer 302. See FIG. 5. FIG. 5 is a cross-sectional diagram illustrating thermal oxidation having been used to oxidize the second metal layer into a metal oxide layer 502 (e.g., to oxidize Ti in the metal bilayer into a $TiO_2$ layer). Metal oxide layer 502 will serve as the gate dielectric. The gate dielectric formed in this manner will be local to the gate. Namely, in the Pd/Ti bilayer example given above, the Pd layer will serve as the bottom gate of the device embedded in insulator 104, with the $TiO_2$ layer as the gate dielectric.

In an alternative approach (not shown), a single conductive metal layer, e.g., of Ti, can be deposited and an upper portion (e.g., top about 1 percent (%) to about 10%) thereof oxidized (by thermal oxidation). In this manner, the upper oxidized portion can serve as the oxide gate dielectric, while the unoxidized portion serves as the bottom gate. It is notable that the Pd/Ti bilayer approach is preferable since the oxidation of the bilayer Pd/Ti should cleanly stop at the Pd/Ti interface.

The steps illustrated in FIGS. 1 to 5 produce a local bottom gate (formed by first metal layer 302) embedded in insulator 104. According to an exemplary embodiment, a top surface of the local bottom gate, formed as described above, is flush with a surface of the insulator 104. Since the surfaces are flush with one another, the top surface of the bottom gate is thus coplanar with the surface of insulator 104. The coplanar gate and insulator provide a flat surface on which the channel material can be formed/deposited (see below). This level interface between the gate and surrounding insulator serves to keep the channel material free of any physical distortions, such as kinks or bends, which can adversely affect carrier transport.

It is notable that, due to production tolerances, in practice the top surface of the gate might end up being slightly higher or slightly lower than the surface of the insulator 104. When the difference between the surfaces is less than or equal to about five nanometers (nm) the surfaces are considered substantially coplanar according to the present teachings. Specifically, if the top surface of the gate is less than or equal to about five nm higher than the surface of the insulator 104 then the top surface of the gate is considered herein to be substantially coplanar with the surface of the insulator 104. Similarly, if the top surface of the gate is less than or equal to about five nm lower than the surface of the insulator 104 then the top surface of the gate is considered herein to be substantially coplanar with the surface of the insulator 104.

Figure 6:
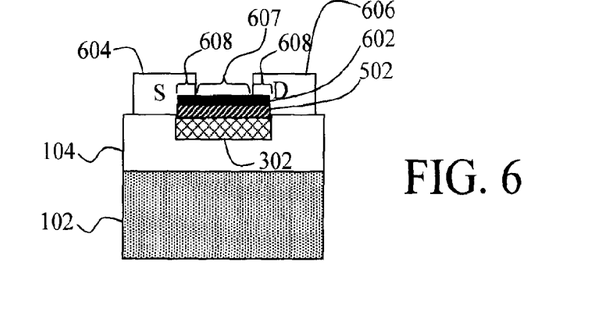
FIG. 6 is a cross-sectional diagram illustrating a layer of graphene or carbon nanotubes having been formed over the $TiO_2$ layer and source/drain contacts having been formed to the graphene or carbon nanotube layer according to an embodiment of the present invention.

A layer of a carbon-based nanostructure material, such as graphene or carbon nanotubes, is then formed over at least a portion of the gate dielectric (i.e., over some or all of the gate dielectric while over none or some of the adjacent insulator). See, FIG. 6. FIG. 6 is a cross-sectional diagram illustrating a layer 602 of graphene or carbon nanotubes having been formed over metal oxide layer 502. When layer 602 is a carbon nanotube layer, the carbon nanotubes may be deposited on metal oxide layer 502 using a deposition processes such as spin-coating. When layer 602 is a graphene layer, the graphene may be deposited on metal oxide layer 502 by layer transfer. In this configuration, a portion 607 of the graphene or carbon nanotube layer above the bottom gate will serve as a channel(s) of the device, while portions 608 of the graphene or carbon nanotube layer on opposing sides of the channel will serve as source and drain regions of the device. It is not however necessary to limit placement of the graphene or carbon nanotube layer to over only metal oxide layer 502. By way of example only, layer 602 may be formed over metal oxide layer 502 and over at least a portion of the insulator 104 (not shown).

As shown in FIG. 6, conductive source and drain contacts 604 and 606, labeled "S" and "D" respectively, are formed to the graphene or carbon nanotube layer on opposing sides of the channel. Source and drain contacts 604 and 606 preferably extend out laterally beyond the bottom gate over insulator 104. According to an exemplary embodiment, source and drain contacts 604 and 606 are metal contacts containing one or more of Pt, Pd and Au and are formed by electron beam or thermal evaporation. The fabrication is now complete. In the completed device structure, as shown in FIG. 6, the gate dielectric (metal oxide layer 502) is local to the bottom gate.

FIGS. 7-10 illustrate an alternative self-aligned approach wherein a localized gate dielectric is formed using the same lift-off stencil that is used to pattern the conductive gate. The process here begins the same as the embodiment described above, wherein a substrate 102 is provided having a layer of insulator 104 thereon (e.g., an oxidized Si substrate), and a trench is patterned in the insulator, e.g., through a lift-off stencil 204 (as described above). See, FIGS. 1 and 2.

Figure 7:
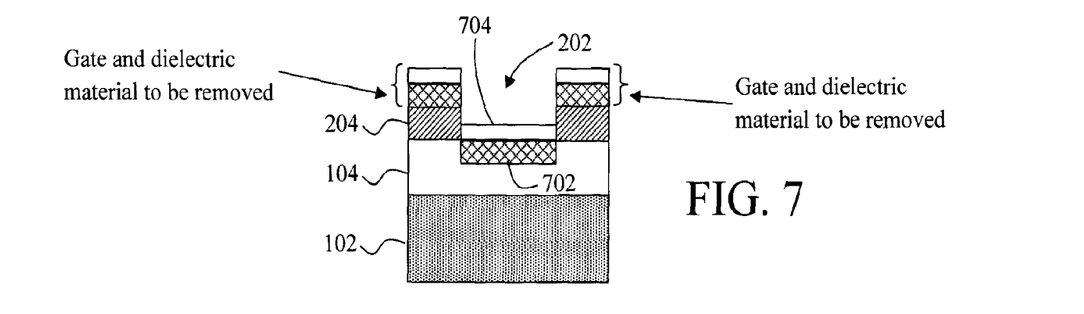
FIG. 7 is a cross-sectional diagram illustrating an alternative embodiment wherein a gate material and a gate dielectric have been deposited into a trench and onto a lift-off stencil in a variation of the first transistor device fabrication process according to an embodiment of the present invention.

Next, as shown in FIG. 7, instead of a bilayer of gate metal, a single layer of electrically conductive gate material is blanket deposited onto the device structure (i.e., onto the lift-off stencil 204) and into the trench, followed by a layer of a gate dielectric being blanket deposited on the layer of gate material. FIG. 7 is a cross-sectional diagram illustrating an electrically conductive gate material 702 having been deposited onto the lift-off stencil 204 and into trench 202, and a gate dielectric material 704 having been deposited on the gate material 702. The conductive gate material 702 may be any of those materials mentioned in conjunction with the description of FIG. 3, above (for example, Ag, Au, Ir, Ni, Pd, Pt, Al, Hf, Nb, Ta, Ti, and/or an alloy containing at least one of the foregoing metals). In general, any electrically conductive material(s) can be used and the particular conductive material(s) selected may vary for p-channel and n-channel devices to tune the threshold voltage accordingly.

Suitable materials for the gate dielectric 704 include, but are not limited to, silicon dioxide and metal oxides. The gate dielectric material can be deposited by collimated reactive sputtering or reactive evaporation at background pressures low enough to keep the deposition directional (rather than conformal, as conformal deposition would coat the sides of the lift-off stencil and interfere with lift-off). However, gate dielectric lift-off may be possible even with relatively conformal processes for dielectric deposition such as chemical vapor deposition (CVD), plasma-assisted CVD, and atomic layer deposition (ALD) if the dielectric layer forms poorly and/or lacks mechanical integrity on the lift-off stencil sidewalls.

Figure 8:
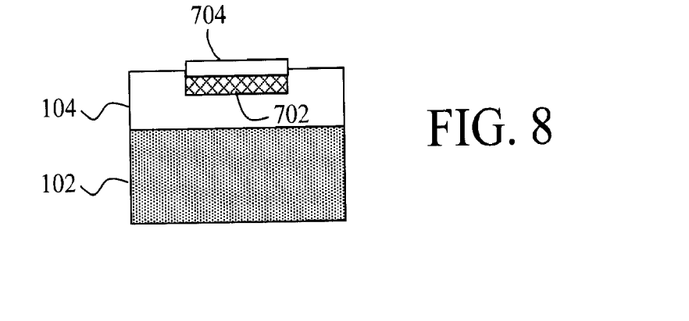
FIG. 8 is a cross-sectional diagram illustrating the gate and gate dielectric material outside of the trench of FIG. 7 having been removed according to an embodiment of the present invention.

Next, a lift-off process is performed on the structure of FIG. 7 to remove the lift-off stencil 204 and hence portions of the conductive gate material and overlying gate dielectric material outside of the trench. See FIG. 8. FIG. 8 is a cross-sectional diagram illustrating the gate material and gate dielectric material outside of trench 202 having been removed. The gate and dielectric material remaining in the trench after the lift-off will serve as the bottom gate and gate dielectric of the device, respectively.

As shown in FIG. 8, the result is the local bottom gate (formed from gate material 702) embedded in insulator 104. According to an exemplary embodiment, a top surface of the local bottom gate, formed as described above, is flush with a surface of the insulator 104. Since the surfaces are flush with one another, the top surface of the bottom gate is thus coplanar with the surface of insulator 104. It is notable that, due to production tolerances, in practice the top surface of the gate might end up being slightly higher or slightly lower than the surface of the insulator. When the difference between the surfaces is less than or equal to about five nm the surfaces are considered substantially coplanar according to the present teachings. Specifically, if the top surface of the gate is less than or equal to about five nm higher than the surface of the insulator 104 then the top surface of the gate is considered herein to be substantially coplanar with the surface of the insulator 104. Similarly, if the top surface of the gate is less than or equal to about five nm lower than the surface of the insulator 104 then the top surface of the gate is considered herein to be substantially coplanar with the surface of the insulator 104.

If desired, optionally, an additional blanket dielectric layer 902 may be (blanket) deposited on localized gate dielectric 704 and insulator 104 to supplement gate dielectric 704. See FIG. 9. More generally, one may employ a multilayer gate dielectric wherein at least one layer thereof (in this case gate dielectric 704) is selectively deposited onto the bottom gate. Similarly, a blanket dielectric layer may be formed on the local gate dielectric of FIG. 5 (i.e., metal oxide layer 502) in the same manner as is being described here to form the multilayer local/blanket gate dielectric configuration of FIG. 9. While this multilayer gate dielectric configuration is not explicitly shown in conjunction with FIG. 5, the implementation thereof is the same as that shown in FIG. 9 and described here.

The use of a multilayer local/blanket gate dielectric configuration may be advantageous when using gate dielectrics that are typically blanket deposited, such as hafnium oxide ($HfO_2$), which may not nucleate well on the gate without the presence of a seed or wetting layer such as a chemical oxide formed on the gate first. It is noted that a gate dielectric such as $HfO_2$ would typically nucleate well on the surface of the surrounding insulator.

According to an exemplary embodiment, when a multilayer local/blanket gate dielectric configuration is employed, local gate dielectric layer 704 of the multilayer gate dielectric may be a thermal or a rapid thermal oxide, such as $SiO_2$ or oxynitride, such as silicon oxynitride ($SiO_xN_y$), or a chemical oxide. Suitable materials for blanket dielectric layer 902 of the multilayer gate dielectric include, but are not limited to, an insulating oxide of a semiconductor (such as $SiO_2$), an insulating nitride of a semiconductor, an insulating oxynitride of a semiconductor, an insulating oxide of a metal (such as $TiO_2$, aluminum oxide ($Al_2O_3$) or $HfO_2$), an insulating nitride of a metal, an insulating oxynitride of a metal, an insulating metal silicate or a layered stack that includes layers composed of at least one of the foregoing materials. Layer 704 preferably has a thickness of from about 3 angstroms to about 15 angstroms, e.g., from about 6 angstroms to about 10 angstroms. According to an exemplary embodiment, layer 902 includes a chemical oxide formed in wet chemical cleans of silicon, e.g., cleans of silicon in $H_2O/NH_4OH/H_2O_2$ with or without $O_3$. When the bottom gate is formed from a Pd/Ti bilayer as described above or from a semiconductor-on-insulator (SOI) layer as described below, for example, a metal oxide or an insulating oxide of a semiconductor (such as $SiO_2$) gate dielectric can be selectively formed using thermal oxidation (see description of FIG. 5, above). This dielectric serves as the first dielectric layer 704. The first dielectric layer can then act as a seed or wetting layer for blanket deposition of the second dielectric layer 902, e.g., a metal oxide such as $HfO_2$ deposited by ALD. The second (blanket) gate dielectric layer 902, formed in this manner, will be present on the local gate dielectric, i.e., first dielectric layer 704, and will extend laterally over at least a portion of the insulator 104 (as shown in FIG. 9).

Figure 10A:
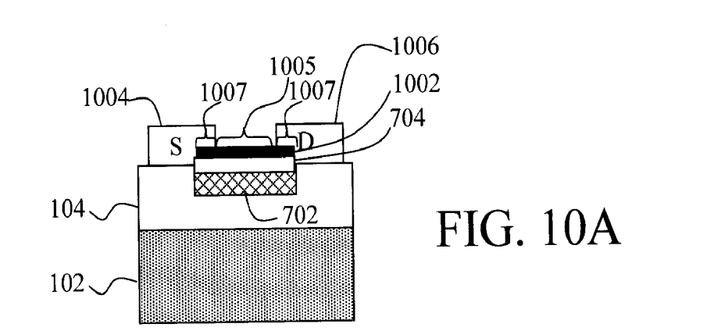
FIG. 10A is a cross-sectional diagram illustrating a layer of graphene or carbon nanotubes having been formed over at least a portion of the gate dielectric of FIG. 8, with source/drain contacts having been formed to the graphene or carbon nanotube layer according to an embodiment of the present invention.

A layer 1002 of a carbon-based nanostructure material, such as graphene or carbon nanotubes, is then formed over at least a portion of the gate dielectric (over some or all of the gate dielectric while over none or some of the adjacent insulator). Following from FIG. 8, FIG. 10A is a cross-sectional diagram illustrating a layer 1002 of graphene or carbon nanotubes having been formed over gate dielectric 704. When layer 1002 is a carbon nanotube layer, the carbon nanotubes may be deposited on gate dielectric 704 using a deposition process such as spin-coating. When layer 1002 is a graphene layer, the graphene may be deposited on gate dielectric 704 using layer transfer. In this configuration, a portion 1005 of the graphene or carbon nanotube layer above the bottom gate will serve as a channel(s) of the device, while portions 1007 of the graphene or carbon nanotube layer on opposing sides of the channel will serve as source and drain regions of the device. It is not however necessary to limit placement of the graphene or carbon nanotube layer to over only gate dielectric 704. By way of example only, layer 1002 may be formed over gate dielectric 704 and over at least a portion of the insulator 104 (not shown).

As shown in FIG. 10A, conductive source and drain contacts 1004 and 1006, labeled "S" and "D" respectively, are formed to the graphene or carbon nanotube layer 1002 on opposing sides of the channel. Source and drain contacts 1004 and 1006 preferably extend out laterally beyond the bottom gate over insulator 104. According to an exemplary embodiment, source and drain contacts 1004 and 1006 are metal contacts containing one or more or Pt, Pd and Au and are formed by electron-beam or thermal evaporation. The fabrication is now complete. In the completed device structure, as shown in FIG. 10A, the gate dielectric is local to the bottom-gate.

Figure 9:
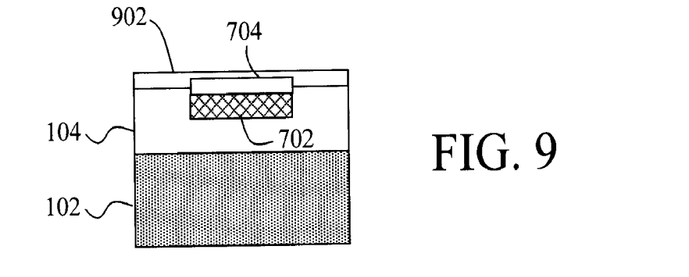
FIG. 9 is a cross-sectional diagram illustrating an optional blanket dielectric layer having been deposited on the structure of FIG. 8 to form a local/blanket multilayer gate dielectric over the gate according to an embodiment of the present invention.
Figure 10B:
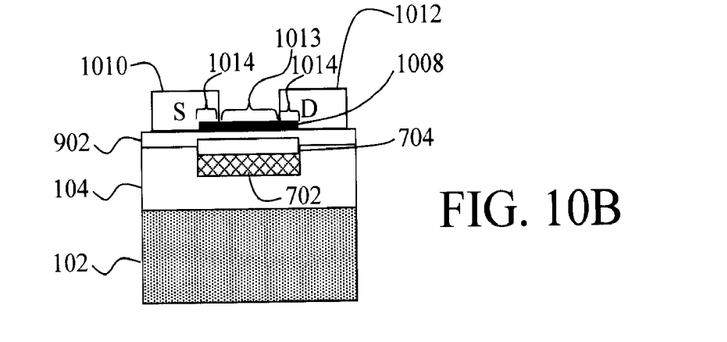
FIG. 10B is a cross-sectional diagram illustrating a layer of graphene or carbon nanotubes having been formed over at least a portion of the gate dielectric of FIG. 9, with source/drain contacts having been formed to the graphene or carbon nanotube layer according to an embodiment of the present invention.

Alternatively, following from FIG. 9, FIG. 10B is a cross-sectional diagram illustrating a layer 1008 of graphene or carbon nanotubes having been formed over multilayer gate dielectric layers 704/902. When layer 1008 is a carbon nanotube layer, the carbon nanotubes may be deposited on multilayer gate dielectric layers 704/902 using a deposition process such as spin-coating. When layer 1008 is a graphene layer, the graphene may be deposited on multilayer gate dielectric layers 704/902 using layer transfer. In this configuration, a portion 1013 of the graphene or carbon nanotube layer above the bottom gate will serve as a channel(s) of the device, while portions 1014 of the graphene or carbon nanotube layer on opposing sides of the channel will serve as source and drain regions of the device. It is not however necessary to limit placement of the graphene or carbon nanotube layer to over only multilayer gate dielectric layers 704/902. By way of example only, layer 1008 may be formed over multilayer gate dielectric layers 704/902 and over at least a portion of the insulator 104 (not shown).

As shown in FIG. 10B, conductive source and drain contacts 1010 and 1012, labeled "S" and "D" respectively, are formed to the graphene or carbon nanotube layer on opposing sides of the channel. Source and drain contacts 1010 and 1012 preferably extend out laterally beyond the bottom gate over the insulator (i.e., dielectric layer 902). According to an exemplary embodiment, source and drain contacts 1010 and 1012 are metal contacts containing one or more or Pt, Pd and Au and are formed by electron-beam or thermal evaporation. The fabrication is now complete. In the completed device structure, as shown in FIG. 10B, at least one layer of the multilayer gate dielectric is local to the bottom gate.

In yet another exemplary embodiment, a local bottom gate is formed by patterning from a blanket layer (versus the example above wherein a trench is used to define the gate), followed by formation of a gate dielectric (blanket or localized) on the bottom gate. This example is shown illustrated in FIGS. 11-15C.

Figure 11:
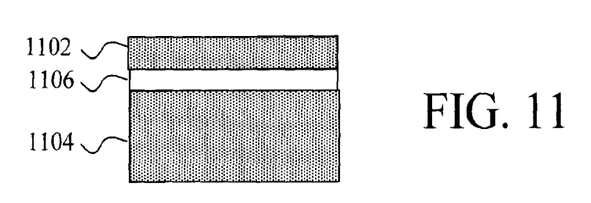
FIG. 11 is a cross-sectional diagram illustrating a starting structure for a second exemplary transistor device fabrication process, e.g., a semiconductor-on-insulator (SOI) wafer having a SOI layer separated from a substrate by a buried oxide (BOX) according to an embodiment of the present invention.

The starting structure in this example is preferably a single crystal SOI wafer (such as a silicon-on-insulator wafer). See FIG. 11. FIG. 11 is a cross-sectional diagram illustrating a starting structure for the fabrication process, namely an SOI wafer having a layer of conductive material, e.g., an SOI layer 1102, separated from a substrate 1104 (i.e., an silicon substrate) by an insulating layer, e.g., a buried oxide (BOX) 1106. According to an exemplary embodiment, SOI layer 1102 is a single crystal SOI layer having a thickness of from about 50 nm to about 100 nm (although thicker or thinner SOI layers are possible), and BOX 1106 is an $SiO_2$ layer having a thickness of from about 100 nm to about 200 nm, e.g., about 150 nm. SOI layer 1102 serves as the gate material and will be used to form the local bottom gate of the device. The use of a single crystal SOI layer as the gate material is advantageous both from a processing point of view, since the technology and infrastructure for shallow trench isolation (STI) is well established, and from a materials point of view, since SOI is extremely smooth and produces high quality thermal oxide (see below).

The conductivity of the SOI layer required for it to properly serve as the gate material may be achieved by ion implantation and activation annealing steps known to those skilled in the art, preferably taking care to preserve the single crystal nature of the SOI gate region by selecting implant conditions that do not amorphize the entire thickness of the SOI layer. Some amorphization of the SOI is acceptable, since the amorphized regions will recrystallize back to single crystal silicon during the activation anneal if some single crystal silicon remains to act as a template for the epitaxial regrowth. If the entire thickness of the SOI layer is amorphized, however, the SOI layer will recrystallize to polycrystalline silicon which would be expected to be both rougher and less conductive than the equivalent single crystal material. These ion implantation and activation annealing steps may be performed before or after SOI layer patterning (see below).

It is not necessary, however, to begin with a single crystal SOI wafer in this example. For instance, one might start with a non-single-crystal silicon layer (such as doped or undoped polycrystalline silicon) as the layer of electrically conductive material on an insulating layer, with the silicon layer serving as the gate material (not shown). More generally, it is possible to start with a blanket or patterned layer of any electrically conductive gate material on an insulating layer. However, for the above-stated reasons, an SOI wafer is preferred, and the following description will focus on an SOI-based implementation.

Figure 12A:
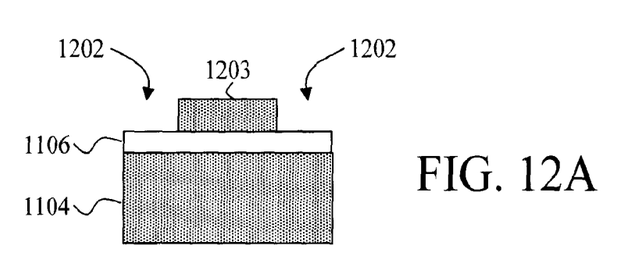
FIG. 12A is a cross-sectional diagram illustrating cavities having been formed extending through the SOI layer, reaching the BOX according to an embodiment of the present invention.
Figure 12B:
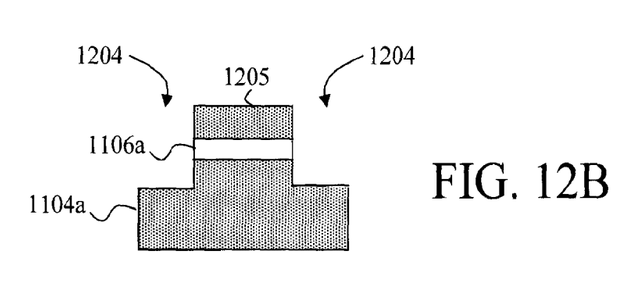
FIG. 12B is a cross-sectional diagram illustrating an alternative embodiment wherein cavities have been formed extending through the SOI layer, through the BOX and part way into the substrate according to an embodiment of the present invention.

Next, the gate material, i.e., the SOI layer in this example, is patterned (i.e., removed in selected areas). The result is a local bottom gate. In this particular SOI-based example, the local bottom gate layer is patterned using shallow trench isolation (STI) techniques, which involve etching cavities in the SOI wafer (so as to isolate one or more portions of the SOI layer) and filling the cavities with a dielectric material (see below). It is notable that the cavities must be made deep enough to reach the BOX. They, however, may be made deeper, if so desired. For example, a deeper trench isolation might be preferable for better electrical isolation between neighboring devices. Accordingly, FIG. 12A is a cross-sectional diagram illustrating cavities 1202 having been formed extending through the conductive material layer, i.e., SOI layer 1102, and into the insulating layer, i.e.. BOX layer 1106. The result is local bottom gate 1203. By comparison, FIG. 12B is a cross-sectional diagram illustrating cavities 1204 having been formed extending through the conductive material layer, i.e., SOI layer 1102, through the insulating layer, i.e., BOX layer 1106 (modified BOX layer now given reference numeral 1106a) and into a portion of substrate 1104 (modified substrate now given reference numeral 1104a). The result is local bottom gate 1205. Cavities 1202/1204 can be formed using a timed etch, such as a timed RIE, with the depth of the cavities being controlled by the length of time of the etch.

Figure 13A:
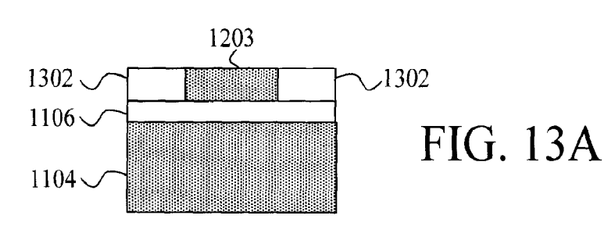
FIG. 13A is a cross-sectional diagram illustrating the cavities of FIG. 12A having been filled with a dielectric according to an embodiment of the present invention.
Figure 13B:
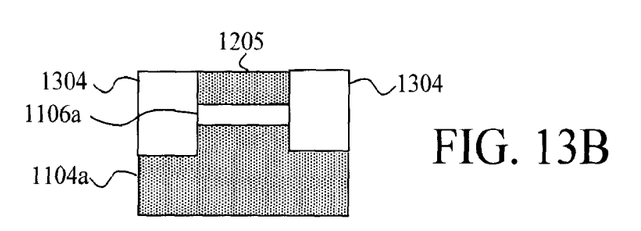
FIG. 13B is a cross-sectional diagram illustrating the cavities of FIG. 12B having been filled with a dielectric according to an embodiment of the present invention.

As with STI process flows known in the art, the cavities are then filled with a dielectric material, e.g., an oxide. The dielectric may be deposited into the cavities using any suitable deposition process, and may be planarized (if desired) using a process such as chemical-mechanical polishing (CMP). Following from FIG. 12A, FIG. 13A is a cross-sectional diagram illustrating cavities 1202 (the shallower cavities) having been filled with a dielectric 1302. Accordingly, following from FIG. 12B, FIG. 13B is a cross-sectional diagram illustrating cavities 1204 (the deeper cavities) having been filled with a dielectric 1304. The same dielectric may be used as dielectrics 1302 and 1304.

In either case, as shown in FIGS. 13A and 13B, the result is the local bottom gate 1203 or 1205, respectively, embedded in an insulator (dielectric). According to an exemplary embodiment, a top surface of the local bottom gate 1203 or 1205, formed as described above, is flush with a surface of the insulator (i.e., dielectric 1302 or 1304). Since the surfaces are flush with one another, the top surface of the respective bottom gate is thus coplanar with the surface of the insulator. It is notable that, due to production tolerances, in practice the top surface of the respective gate might end up being slightly higher or slightly lower than the surface of the insulator. When the difference between the surfaces is less than or equal to about five nm the surfaces are considered substantially coplanar according to the present teachings. Specifically, if the top surface of the respective gate is less than or equal to about five nm higher than the surface of the insulator then the top surface of the gate is considered herein to be substantially coplanar with the surface of the insulator. Similarly, if the top surface of the respective gate is less than or equal to about five nm lower than the surface of the insulator then the top surface of the gate is considered herein to be substantially coplanar with the surface of the insulator.

A gate dielectric is then formed over the bottom gate. The gate dielectric can be a blanket dielectric over the bottom gate and other surfaces (i.e., at least a portion of the insulator, i.e., dielectric 1302 or 1304), a local dielectric over only the bottom gate, or a combination of a local and a blanket dielectric. For ease of depiction, these three dielectric configurations will be illustrated in FIGS. 14A, 14B and 14C with reference to the shallow cavity embodiment (of FIGS. 12A and 13A) with the understanding that the same process are applicable to the deep cavity variant (FIGS. 12B and 13B) as well.

Figure 14A:
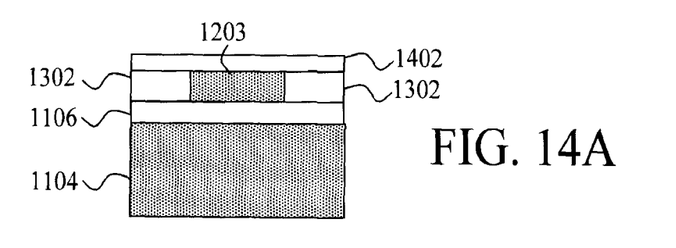
FIG. 14A is a cross-sectional diagram illustrating a gate dielectric having been blanket deposited on a bottom gate and on the dielectric according to an embodiment of the present invention.

FIG. 14A is a cross-sectional diagram illustrating a gate dielectric 1402 having been blanket deposited on bottom gate 1203 and on at least a portion of dielectric 1302 (or on bottom gate 1205 and on at least a portion of dielectric 1304 in the case of the deep cavity embodiment). According to an exemplary embodiment, gate dielectric 1402 is an insulating oxide, nitride, or oxynitride of a semiconductor or of a metal such as the semiconductor oxide silicon dioxide ($SiO_2$), the metal oxide $TiO_2$, $Al_2O_3$ or $HfO_2$, an insulating metal silicate; or a layered stack including at least one of these materials. Gate dielectric 1402 may be deposited by any technique known to the art including, but not limited to physical vapor deposition (PVD) (e.g., sputtering and evaporation), CVD, plasma-assisted CVD and any of these methods combined with additional oxidation steps.

Figure 14B:
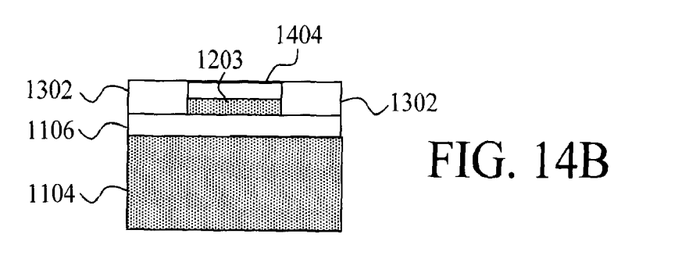
FIG. 14B is a cross-sectional diagram illustrating an alternative embodiment wherein a gate dielectric has been formed that is local to a bottom gate according to an embodiment of the present invention.

A second option is to use a local gate dielectric configuration. FIG. 14B is a cross-sectional diagram illustrating a gate dielectric 1404 having been formed that is local to bottom-gate 1203 (or bottom gate 1205 in the case of the deep cavity embodiment). In this exemplary embodiment, gate dielectric 1404 may be formed by a thermal or chemical oxidation of a portion of the bottom gate. This thermal oxidation technique was described in conjunction with the description of FIG. 5, above. In the example of FIG. 5, a Pd/Ti bilayer was used. Here, bottom gate 1203 is formed from the SOI layer, and thus contains silicon. An upper portion of SOI bottom gate 1203 may therefore be oxidized to form $SiO_2$ gate dielectric 1404. Methods of oxidizing silicon to form controlled thicknesses of $SiO_2$ are well known to those of skill in the art and are thus not described further herein. An alternative way to achieve a local gate dielectric configuration is through selective deposition.

Figure 14C:
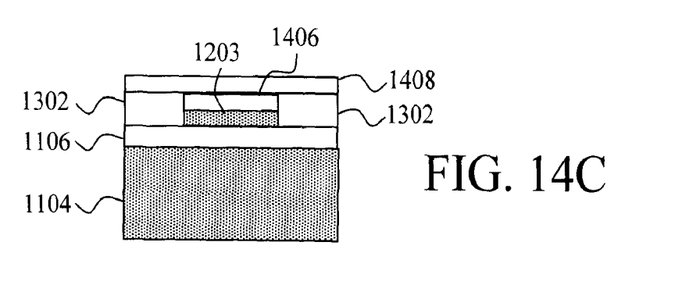
FIG. 14C is a cross-sectional diagram illustrating another alternative embodiment wherein an optional blanket gate dielectric layer has been formed on the structure of FIG. 14B to form a multilayer local/blanket gate dielectric over a bottom gate according to an embodiment of the present invention.

A third option is to form a local gate dielectric (for example, as shown in FIG. 14B) and then form a blanket gate dielectric over the local gate dielectric. This configuration is shown in FIG. 14C. FIG. 14C is a cross-sectional diagram illustrating a gate dielectric made up of two dielectric layers, a gate dielectric 1406 that is local to bottom gate 1203 (or bottom gate 1205 in the case of the deep cavity embodiment) and a blanket gate dielectric 1408 over the local dielectric 1406 and on at least a portion of dielectric 1302. In this exemplary embodiment, local gate dielectric 1406 is formed in the same manner as shown in FIG. 14B, and described above, e.g., by thermal oxidation. Blanket gate dielectric layer 1408 is deposited on local dielectric 1406 using any technique known in the art including all of those mentioned in connection with blanket gate dielectric layer 1402 of FIG. 14A. According to an exemplary embodiment, gate dielectric 1406 is an insulating oxide, such as $SiO_2$ and gate dielectric 1408 is a metal oxide.

Figure 15A:
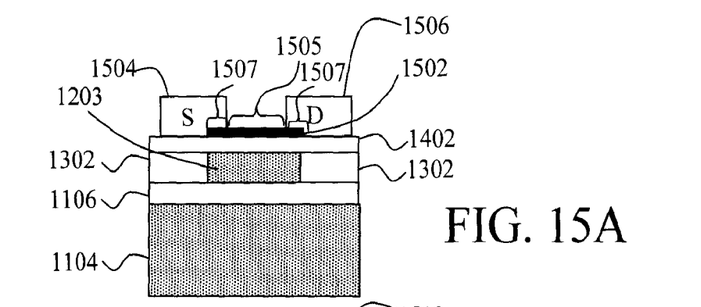
FIG. 15A is a cross-sectional diagram illustrating a layer of graphene or carbon nanotubes having been formed over at least a portion of the gate dielectric of FIG. 14A and source/drain contacts having been formed to the graphene or carbon nanotube layer according to an embodiment of the present invention.
Figure 15B:
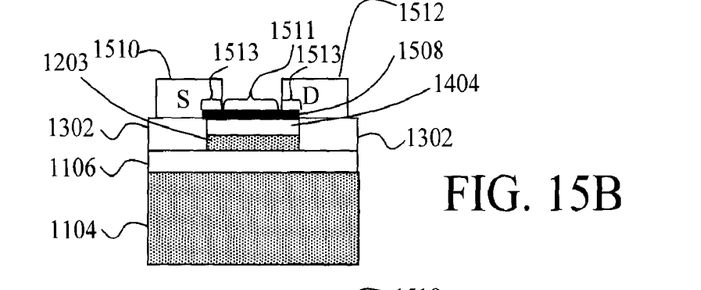
FIG. 15B is a cross-sectional diagram illustrating a layer of graphene or carbon nanotubes having been formed over at least a portion of the gate dielectric of FIG. 14B and source/drain contacts having been formed to the graphene or carbon nanotube layer according to an embodiment of the present invention.
Figure 15C:
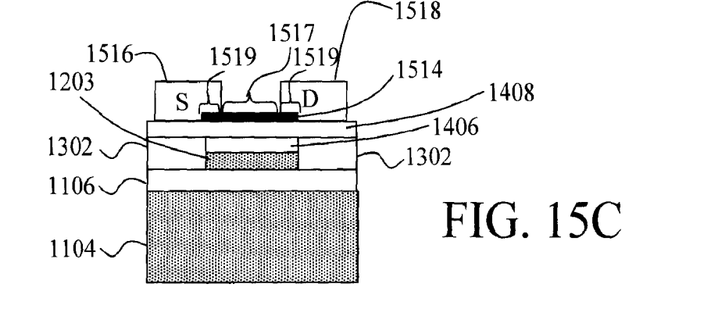
FIG. 15C is a cross-sectional diagram illustrating a layer of graphene or carbon nanotubes having been formed over at least a portion of the multilayer local/blanket gate dielectric of FIG. 14C according to an embodiment of the present invention.

A layer of a carbon-based nanostructure material, such as graphene or carbon nanotubes, is then formed on the gate dielectric. The various configurations of FIGS. 14A-C, namely, blanket gate dielectric, local gate dielectric or multilayer local/blanket gate dielectric, after graphene or carbon nanotube formation, are shown in FIGS. 15A-C, respectively. Specifically, FIG. 15A is a cross-sectional diagram illustrating a layer 1502 of graphene or carbon nanotubes having been formed over at least a portion of gate dielectric 1402 (of FIG. 14A, blanket gate dielectric configuration). When layer 1502 is a carbon nanotube layer, the carbon nanotubes may be deposited on gate dielectric 1402 using a deposition process such as spin-coating. When layer 1502 is a graphene layer, the graphene may be deposited on gate dielectric 1402 using a deposition process such as CVD. In this configuration, a portion 1505 of the graphene or carbon nanotube layer above the bottom gate will serve as a channel(s) of the device, while portions 1507 of the graphene or carbon nanotube layer on opposing sides of the channel will serve as source and drain regions of the device.

As shown in FIG. 15A, conductive source and drain contacts 1504 and 1506, labeled "S" and "D" respectively, are formed to the graphene or carbon nanotube layer on opposing sides of the channel. Source and drain contacts 1504 and 1506 preferably extend out laterally beyond the bottom gate over the insulator (i.e., dielectric 1302). According to an exemplary embodiment, source and drain contacts 1504 and 1506 are metal contacts containing one or more or Pt, Pd and Au and are formed by electron-beam or thermal evaporation. The fabrication is now complete.

FIG. 15B is a cross-sectional diagram illustrating a layer 1508 of graphene or carbon nanotubes having been formed over at least a portion of gate dielectric 1404 (of FIG. 14B, local gate dielectric-thermal oxidation configuration). When layer 1508 is a carbon nanotube layer, the carbon nanotubes may be deposited on gate dielectric 1404 using a deposition process such as spin-coating. When layer 1508 is a graphene layer, the graphene may be deposited on gate dielectric 1404 using a deposition process such as CVD. In this configuration, a portion 1511 of the graphene or carbon nanotube layer above the bottom gate will serve as a channel(s) of the device, while portions 1513 of the graphene or carbon nanotube layer on opposing sides of the channel will serve as source and drain regions of the device. It is not however necessary to limit placement of the graphene or carbon nanotube layer to over only gate dielectric 1404. By way of example only, layer 1508 may be formed over gate dielectric 1404 and over at least a portion of the dielectric 1302 (not shown).

As shown in FIG. 15B, conductive source and drain contacts 1510 and 1512, labeled "S" and "D" respectively, are formed to the graphene or carbon nanotube layer on opposing sides of the channel. Source and drain contacts 1510 and 1512 preferably extend out laterally beyond the bottom gate over the insulator (i.e., dielectric 1302). According to an exemplary embodiment, source and drain contacts 1510 and 1512 are metal contacts containing one or more or Pt, Pd and Au and are formed by electron-beam or thermal evaporation. The fabrication is now complete. In the completed device structure, as shown in FIG. 15B, the gate dielectric is local to the bottom gate.

FIG. 15C is a cross-sectional diagram illustrating a layer 1514 of graphene or carbon nanotubes having been formed over at least a portion of gate dielectric 1408 (of FIG. 14C, local gate dielectric/blanket gate dielectric combination). When layer 1514 is a carbon nanotube layer, the carbon nanotubes may be deposited on gate dielectric 1408 using a deposition processes such as spin-coating. When layer 1514 is a graphene layer, the graphene may be deposited on gate dielectric 1408 using a deposition process such as CVD. In this configuration, a portion 1517 of the graphene or carbon nanotube layer above the bottom gate will serve as a channel(s) of the device, while portions 1519 of the graphene or carbon nanotube layer on opposing sides of the channel will serve as source and drain regions of the device. It is not however necessary to limit placement of the graphene or carbon nanotube layer to over only gate dielectric 1408.

As shown in FIG. 15C, conductive source and drain contacts 1516 and 1518, labeled "S" and "D" respectively, are formed to the graphene or carbon nanotube layer on opposing sides of the channel. Source and drain contacts 1516 and 1518 preferably extend out laterally beyond the bottom gate over the insulator (dielectric layer 1408). According to an exemplary embodiment, source and drain contacts 1516 and 1518 are metal contacts containing one or more or Pt, Pd and Au and are formed by electron-beam or thermal evaporation. The fabrication is now complete. In the completed device structure, as shown in FIG. 15C, the gate dielectric is local to the bottom gate.

It should be noted that the bottom gated carbon channel devices described herein may further include additional elements such as top passivation layers (e.g., to protect exposed graphene or carbon nanotube surfaces from environmental contamination) and top gates over top gate dielectrics disposed on the carbon channel (to make a double gated device). It is also noted that the carbon channel devices of the present invention may be utilized in circuits individually or in a plurality, and that circuits including at least one of the carbon channel devices may further include one or more devices with non-carbon channels.

Figure 16:
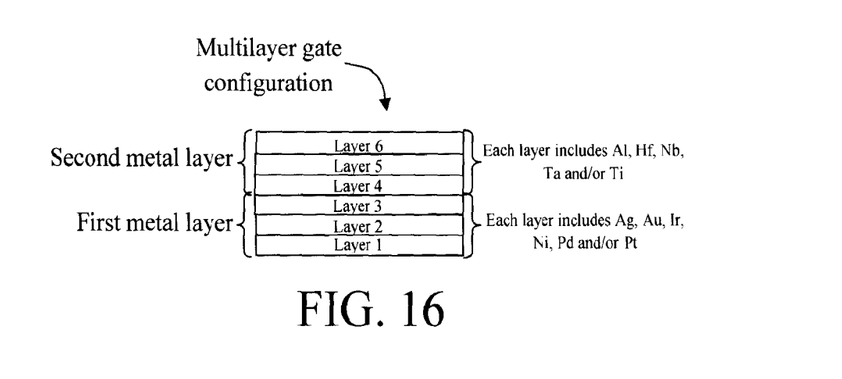
FIG. 16 is a cross-sectional diagram illustrating an exemplary layered stack gate configuration according to an embodiment of the present invention.

As described above, it may be desirable to form a multilayer gate configuration during the fabrication of the present devices. For example, as described in conjunction with the description of FIG. 3, above, a multilayer gate configuration may involve a first metal layer made from a metal or metals or an alloy thereof that is/are relatively resistant to oxidation, and a second metal layer on the first metal layer that is made from a metal or metals or an alloy thereof that is/are relatively easily oxidized. Each of the first and second metal layers can be made of a single layer, or as shown in FIG. 16, both the first and second metal layers can each be composed of a multilayer stack of metal layers (i.e., labeled "Layer 1" through "Layer 6"). In this exemplary embodiment, the first metal layer would be made up of a stack of metal layers, each layer in the stack being composed of a metal or metals or an alloy that is/are relatively resistant to oxidation (for example, each layer making up the first metal layer contains Ag, Au, Ir, Ni, Pd, Pt or an alloy containing at least one of the foregoing metals). Each of the metal layers may be deposited using electron beam or thermal evaporation. Likewise, the second metal layer would be made up of a stack of metal layers, each layer in the stack being composed of a metal or metals that is/are relatively easily oxidized (for example, each layer making up the second metal layer contains Al, Hf, Nb, Ta, Ti or an alloy containing at least one of the foregoing metals). Each of the metal layers may be deposited using electron beam or thermal evaporation. In the example shown in FIG. 16 the first metal layer and the second metal layer are each made up of a composite of three layers. This is merely an example and more or fewer layers may be employed. For instance, as described above, the first metal layer can be made up of multiple layers of materials while the second metal layer can be a single material, and vice versa.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A transistor device, comprising:
   a substrate;
   an insulator on the substrate;
   a local bottom gate embedded in the insulator, wherein a top surface of the gate is substantially coplanar with a surface of the insulator;
   a local gate dielectric on the bottom gate;
   a carbon-based nanostructure material over at least a portion of the local gate dielectric, wherein a portion of the carbon-based nanostructure material serves as a channel of the device; and
   conductive source and drain contacts to one or more portions of the carbon-based nanostructure material on opposing sides of the channel that serve as source and drain regions of the device.

2. The device of claim 1, wherein the carbon-based nanostructure material comprises a graphene or carbon nanotube layer.

3. The device of claim 1, wherein the insulator comprises silicon dioxide.

4. The device of claim 1, wherein the local bottom gate comprises a conductive material selected from the group consisting of doped polycrystalline silicon, doped single-crystal silicon, at least one metal and a layered stack of conductive materials.

5. The device of claim 1, wherein the local gate dielectric comprises a material selected from the group consisting of an insulating oxide, an insulating nitride, an insulating oxynitride, and combinations comprising at least one of the foregoing materials in a layered configuration.

6. The device of claim 1, further comprising:
   a blanket gate dielectric on the local gate dielectric and at least a portion of the insulator.

7. The device of claim 4, wherein the local bottom gate comprises palladium, and wherein the local gate dielectric comprises titanium oxide.

8. The device of claim 5, wherein the local gate dielectric comprises silicon dioxide.

9. The device of claim 6, wherein the local gate dielectric comprises silicon dioxide and the blanket gate dielectric comprises a metal oxide.

10. A method of fabricating a transistor device, comprising the steps of:
    providing a substrate having an insulator thereon;
    forming a local bottom gate in a trench in the insulator;
    forming a local gate dielectric on the bottom gate;
    forming a carbon-based nanostructure material over at least a portion of the local gate dielectric, wherein a portion of the carbon-based nanostructure material serves as a channel of the device; and
    forming conductive source and drain contacts to one or more portions of the carbon-based nanostructure material on opposing sides of the channel that serve as source and drain regions of the device.

11. The method of claim 10, further comprising the step of:
    etching the trench in the insulator through a patterned resist layer.

12. The method of claim 10, wherein the step of forming the local gate dielectric on the bottom gate comprises the step of:
    oxidizing an upper portion of the bottom gate to form an oxide dielectric.

13. The method of claim 10, further comprising the step of:
    forming a blanket gate dielectric on the local gate dielectric and at least a portion of the insulator.

14. The method of claim 11, wherein the step of forming the bottom-gate in the trench comprises the steps of:
    blanket depositing a gate material onto the patterned resist layer and into the trench; and
    removing the patterned resist layer and the gate material outside of the trench.

15. The method of claim 11, further comprising the steps of:
    blanket depositing a gate material onto the patterned resist layer and into the trench;
    blanket depositing a gate dielectric material onto the gate material; and
    removing the patterned resist layer along with portions of the gate material and portions of the gate dielectric material outside of the trench.

16. A method of fabricating a transistor device, comprising the steps of:
    providing a wafer having a layer of electrically conductive material on an insulating layer;
    forming cavities in the wafer to isolate one or more portions of the conductive material, wherein an isolated portion of the conductive material serves as a local bottom gate of the device;
    filling the cavities with a dielectric;
    forming a gate dielectric on the bottom gate;
    forming a carbon-based nanostructure material over at least a portion of the gate dielectric, wherein a portion of the carbon-based nanostructure material serves as a channel of the device; and
    forming conductive source and drain contacts to one or more portions of the carbon-based nanostructure material on opposing sides of the channel that serve as source and drain regions of the device.

17. The method of claim 16, wherein the layer of conductive material comprises a single crystal semiconductor-on-insulator layer and the insulating layer comprises a buried oxide.

18. The method of claim 16, wherein the layer of conductive material comprises doped polycrystalline silicon.

19. The method of claim 16, wherein the cavities extend into the insulating layer.

20. The method of claim 16, wherein the cavities extend through the insulating layer.

21. The method of claim 16, wherein the gate dielectric formed on the bottom gate is local to the bottom gate.

22. The method of claim 16, wherein the step of forming the gate dielectric on the bottom gate comprises the step of:
    blanket depositing a gate dielectric material on the bottom gate and on at least a portion of the dielectric filling the cavities.

23. The method of claim 16, wherein the step of forming the gate dielectric on the bottom gate comprises the steps of:
    forming a local gate dielectric on the bottom gate; and
    forming a blanket gate dielectric on the local gate dielectric and at least a portion of the dielectric filling the cavities.

24. The method of claim 16, wherein the step of forming the gate dielectric on the bottom gate comprises the step of:
    oxidizing an upper portion of the bottom gate to form an oxide dielectric.

* * * * *